United States Patent [19]

Takei et al.

[11] 3,791,883

[45] Feb. 12, 1974

[54] SEMICONDUCTOR ELEMENT HAVING SURFACE COATING AND METHOD OF MAKING THE SAME

[75] Inventors: Ichiro Takei, Kodaira-shi; Katsuyoshi Sasaki, Jujisawa-shi; Sumio Nishida, Kodaira-shi, all of Japan

[73] Assignee: Hitachi, Ltd., Tokyo, Japan

[22] Filed: July 15, 1969

[21] Appl. No.: 860,450

Related U.S. Application Data

[62] Division of Ser. No. 623,903, March 17, 1967.

[30] Foreign Application Priority Data

Mar. 23, 1966 Japan ............................... 41-17415

[52] U.S. Cl. ................................ 148/187, 148/189

[51] Int. Cl. ............................................ H01l 7/34

[58] Field of Search ............................ 148/187, 188

[56] References Cited

UNITED STATES PATENTS

| | | | |
|---|---|---|---|
| 3,352,726 | 11/1967 | Luce | 148/187 |
| 3,421,936 | 11/1969 | Vogel, Jr. | 117/106 |
| 3,475,234 | 10/1969 | Kerwin et al. | 148/187 |
| 3,477,886 | 11/1969 | Ehlenberger | 148/187 |
| 3,484,313 | 12/1969 | Tauchi et al. | 148/187 |
| 3,544,399 | 10/1966 | Dill | 148/187 |
| 3,597,667 | 8/1971 | Horn | 148/187 X |
| 3,479,237 | 11/1969 | Bergh et al. | 156/11 |
| 3,534,234 | 10/1970 | Clevenger | 317/235 |

*Primary Examiner*—L. Dewayne Rutledge
*Assistant Examiner*—J. M. Davis
*Attorney, Agent, or Firm*—Craig, Antonelli and Hill

[57] ABSTRACT

A semiconductor element having a surface coating consisting of, for example, a silicon nitride film and a silicon oxide film covering different surface portions of a semiconductor substrate of, for example, silicon so that such surface coating can be utilized for selective diffusion of impurities such as gallium and antimony. In a semiconductor device thus formed, the surface coating acts as a satisfactory surface protective film against external atmosphere, and the backward characteristics of the PN junction can be improved because the end edge of the PN junction terminating at the substrate surface is covered with the silicon nitride film.

17 Claims, 35 Drawing Figures

INVENTORS
ICHIRO TAKEI, KATSUYOSHI SASAKI and
SUMIO NISHIDA

BY
Craig, Antonelli, Stewart & Hill
ATTORNEYS

INVENTORS

ICHIRO TAKEI, KATSUYOSHI SASAKI and SUMIO NISHIDA

BY Craig, Antonelli, Stewart & Hill

ATTORNEYS

INVENTORS
ICHIRO TAKEI, KATSUYOSHI SASAKI
and SUMIO NISHIDA

BY Craig, Antonelli, Stewart & Hill
ATTORNEYS

INVENTORS

ICHIRO TAKEI, KATSUYOSHI SASAKI and SUMIO NISHIDA

BY Craig, Antonelli, Stewart & Hill

ATTORNEYS

INVENTORS
ICHIRO TAKEI, KATSUYOSHI SASAKI and
SUMIO NISHIDA

BY Craig, Antonelli, Stewart & Hill
ATTORNEYS

INVENTORS
ICHIRO TAKEI, KATSUYOSHI SASAKI and
SUMIO NISHIDA

BY Craig, Antonelli, Stewart & Hill
ATTORNEYS

INVENTORS

ICHIRO TAKEI, KATSUYOSHI SASAKI and SUMIO NISHIDA

BY

Craig, Antonelli, Stewart & Hill

ATTORNEYS

SEMICONDUCTOR ELEMENT HAVING SURFACE COATING AND METHOD OF MAKING THE SAME

This is a division of application Ser. No. 623,903, filed Mar. 17, 1967.

This invention relates to semiconductor elements and to a method of making the same, and more particularly to semiconductor elements having a novel surface coating thereon and to a method of making the same. This invention further relates to a method of causing selective diffusion of impurities into the semiconductor substrate by the utilization of the above surface coating.

Heretofore semiconductor devices such as diodes, transistors or semiconductor integrated circuits have been provided with a surface protective film on their semiconductor substrate surface in order to provide protection against the detrimental external influence as by moisture and dust on their electrical properties. In a silicon planar type transistor, for example, it has been a common practice to employ a silicon oxide film as the surface protective film, suitably form a hole through this silicon oxide film and cause selective diffusion of an impurity into the silicon substrate through this hole or cause deposition of a metal on the substrate surface to form an electrode thereon. However, in spite of the fact that such a semiconductor device has its surface protected by the silicon oxide film, such device has been liable to be affected by the external atmosphere with the result that deteriorations of its electrical properties and reliability have been frequently encountered. Further in a semiconductor device in which its PN junction extends to the semiconductor substrate surface below the silicon oxide film, its backward characteristics have been largely affected by the properties of the silicon oxide film with the result that it has sometimes been impossible to obtain satisfactory electrical properties. Further in making a semiconductor device of this type, the silicon oxide film is commonly employed as a diffusion mask so that an impurity can be selectively diffused into the semiconductor substrate. However, with the silicon oxide film it has been impossible to cause selective diffusion of gallium because the silicon oxide film has no masking action with respect to gallium, and therefore boron had to be employed as an impurity where it is required to selectively form a P-type semiconductor region in the semiconductor substrate. In view of the nature of these impurities, however, boron is only usable to treat ten to thirty semiconductor wafers at most in one diffusion treatment step, whereas gallium is usable to treat about one hundred semiconductor wafers at a time in one diffusion treatment step. For the above reason, there has been an ever-increasing demand for the development of a technique for selective diffusion of gallium in order to realize the mass production of semiconductor devices of the kind described.

The present invention contemplates to eliminate the above and other defects involved in prior semiconductor devices as described above and to provide new and improved semiconductor devices which satisfy the above demand.

It is the primary object of the present invention to provide a semiconductor element having a novel surface coating.

Another object of the invention is to provide a method of making such a semiconductor element.

Still another element object of the invention is to provide a method of mass production of semiconductor devices.

A further object of the invention is to provide a mask satisfactorily usable in selectively diffusing an impurity into a semiconductor substrate.

A still further object of the invention is to provide a method of selectively diffusing gallium into a semiconductor substrate.

Various objects as described above can be attained by the present invention as will be described below.

The novel surface coating provided on the surface of semiconductor devices in accordance with the present invention comprises a combination of a silicon oxide film and a silicon nitride film.

According to one embodiment of the invention, the surface coating may comprise a silicon oxide film provided on at least a portion of the semiconductor substrate surface and a silicon nitride film provided on at least a portion of that part of the semiconductor substrate surface on which the above silicon oxide film is not provided.

According to another embodiment of the invention, the above surface coating may comprise a silicon oxide film provided on the semiconductor substrate surface and a silicon nitride film selectively disposed on the silicon oxide film. By disposing the silicon nitride film on the semiconductor substrate surface with the silicon oxide film interposed therebetween, it is possible to reduce the mechanical distortion due to the difference between thermal expansion coefficients of the semiconductor substrate and the silicon nitride film.

In an experiment with a semiconductor device having in its semiconductor substrate a PN junction extending to the semiconductor substrate surface, it was possible to obtain satisfactory electrical properties by covering this PN junction with the above surface coating according to the invention. For instance, it was possible to improve the electrical properties, especially the backward characteristics of the PN junction exposed to the semiconductor substrate surface by covering this PN junction with a silicon nitride film or by covering this PN junction with a silicon oxide film and then providing a silicon nitride film on this silicon oxide film.

It was further found that the surface coating according to the present invention was very effective for use as a mask for impurity diffusion. In other words, it was found that the silicon nitride film in the surface coating according to the invention has a masking action for diffusion of gallium and various other impurities. It was possible to cause selective diffusion of gallium into the semiconductor substrate by using this silicon nitride film as a mask during gallium diffusion.

On the other hand, according to the invention, a hole may be formed through the silicon oxide film which is more easily etched than the silicon nitride film in the surface coating and this hole may be utilized for selective diffusion of an impurity into the substrate or for deposition of a metal for forming an electrode.

Further it is possible to very easily make various semiconductor devices by suitably employing the above techniques, that is, by a suitable combination of the selective diffusion technique by use of the silicon nitride film, the selective diffusion technique by use of the silicon oxide film and the electrode forming or deposition technique.

The foregoing and other objects and features of the invention will become more readily apparent from the following detailed description of preferred embodiments of the present invention when taken in conjunction with the appended drawings; in which:

FIGS. 1*a* to 1*d* are vertical sectional views showing prior manufacturing steps for a planar type transistor;

FIGS. 12*a* to 12*f* are vertical sectional views of semiconductor devices illustrating steps of a method for manufacturing them according to the invention;

FIGS. 13*a* to 13*e* are vertical sectional views of semiconductor devices illustrating steps of another method for manufacturing them according to the invention;

FIGS. 14*a* to 14*d* are vertical sectional views of semiconductor devices illustrating steps of still another method for manufacturing them according to the invention;

FIGS. 15*a* to 15*f* are vertical sectional views of semiconductor devices illustrating steps of still another method for manufacturing them according to the invention.

In a conventional planar type transistor, a silicon oxide film is used as a mask and an acceptor impurity and a donor impurity are alternately diffused into a silicon substrate to form therein a base layer and an emitter layer. The planar type transistor is featured by the fact that, even though the silicon oxide film used as the diffusion mask is partly removed in an intermediate step, the silicon oxide film is finally left on the substrate surface to cover the emitter junction and collector junction for protecting these junctions from the external atmosphere.

Figure 1A:
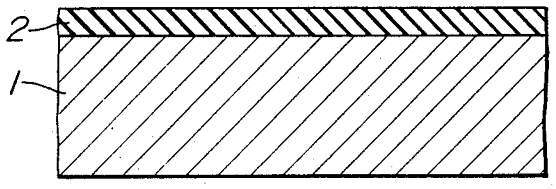
Figure 1B:
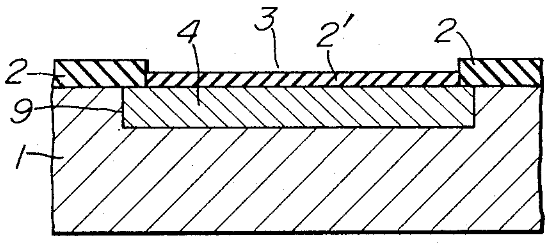
Figure 1C:
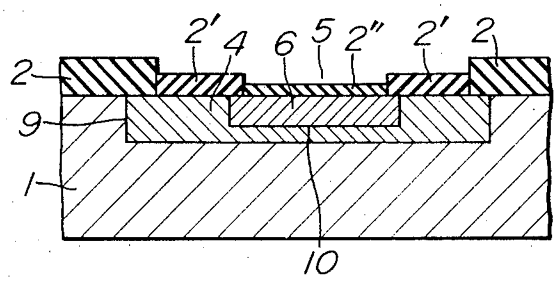
Figure 1D:
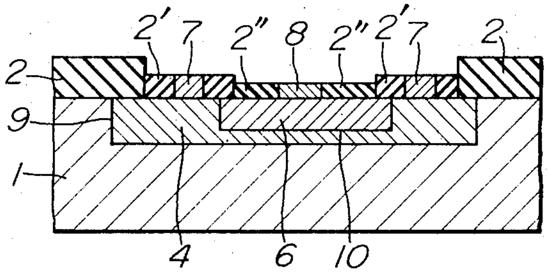

At first, a method of making such conventional planar type transistor will be described with reference to FIGS. 1*a* to 1*d*. As shown in FIG. 1*a*, an N-type silicon substrate 1 is first prepared. After cleaning treatment on the surface of the substrate 1, the silicon substrate 1 is heated in an oxidizing atmosphere to form a silicon oxide film 2 on the surface thereof. The photo engraving technique is then applied to selectively remove a desired portion of the silicon oxide film 2 to form a hole 3 therethrough and to expose that portion of the substrate 1 as shown in FIG. 1*b*. An acceptor impurity, boron, is caused to diffuse through the exposed substrate surface to form a P-type base layer 4 in the substrate 1. During this diffusion treatment, a fresh silicon oxide film 2′ is again formed on the exposed substrate surface. Then as shown in FIG. 1*c*, a desired portion of the newly formed silicon oxide film 2′ is again removed to form a hole 5 and to expose that portion of the substrate surface. A donor impurity, for example, phosphorus is caused to diffuse through the exposed substrate surface into the substrate to form an N-type emitter layer 6. As in the case of the above-described base diffusion treatment, a fresh silicon oxide film 2″ is formed on the substrate surface during this emitter diffusion treatment. Thus, operating regions of an NPN transistor are completed. Subsequently, holes are formed through the silicon oxide films on the respective operating regions and aluminum electrodes 7 and 8 are deposited through these holes as shown in FIG. 1*d*. In the planar type transistor made in this manner, the silicon oxide films 2, 2′ and 2″ are left in their disposed state on the substrate surface and cover the PN junctions, that is, the emitter juction 10 and the collector junction 9 extending to the substrate surface. However, such planar type transistor commonly has a poor reliability, and especially deterioration of the electrical properties of the backbiased collector junction 9 takes place frequently. Occurrence of such a phenomenon is presently considered to be attributable to the fact that metal ions penetrate into the silicon oxide film during the step of impurity diffusion or the step of electrode metal deposition or other treatment steps and this metal ion affects the surface state of the semiconductor substrate surface beneath the silicon oxide film.

The present invention provides a semiconductor element having a novel surface coating free from the various prior defects as described above and a method of making such semiconductor element. Various embodiments of the present invention will be described in detail hereunder.

Figure 2:
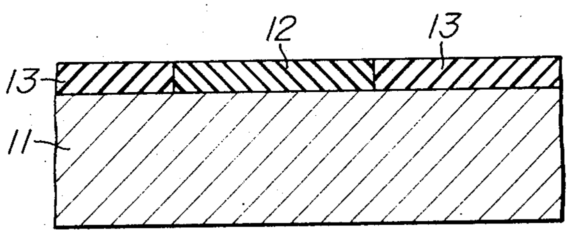
FIGS. 2 and 3 are vertical sectional views each showing one form of a semiconductor element having a surface coating according to the invention.

FIG. 2 is a vertical sectional view showing one form of a semiconductor element having the surface coating according to the invention. According to this embodiment, the semiconductor element of the invention is characterized by having a surface coating comprising a silicon oxide film 12 covering at least a portion of the surface of a semiconductor substrate 11 and a silicon nitride film 13 covering at least a portion of the remaining substrate surface.

Figure 3:
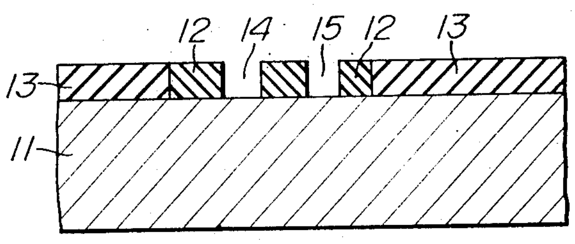

In the semiconductor element having the surface coating of the invention as described above, suitable holes 14 and 15 may be formed through the silicon oxide film 12 as, for example, shown in FIG. 3, and an impurity may be selectively diffused through these holes into the semiconductor substrate 11 or metal electrodes may be deposited therethrough to make a desired semiconductor device.

The surface coating of the structure as shown in FIG. 2 may, for example, be obtained by pre-forming a silicon oxide film 12 on at least a portion of the surface of a semiconductor substrate 11 and heating this semiconductor substrate 11 in a nitrogenous atmosphere to have a silicon nitride film 13 formed on the exposed semiconductor substrate surface. Alternatively, the surface coating as shown in FIG. 2 may, for example, be obtained by pre-forming a silicon oxide film 12 on at least a portion of the surface of a semiconductor substrate 11 and causing a nitride such, for example, as ammonia ($NH_3$) or hydrazine ($N_2H_4$) to react with a silicon compound such, for example, as silane ($SiH_4$) for thereby causing deposition of a silicon nitride film 13 on the surface of the semiconductor substrate 11 from the vapor phase.

Figure 4:
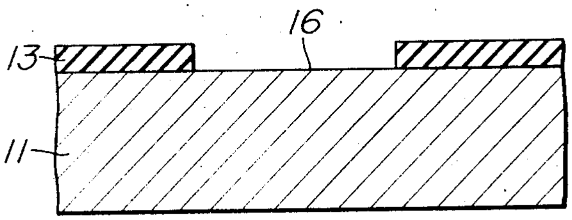
FIGS. 4 and 5 are vertical sectional views of semiconductor elements for illustrating steps for manufacturing them according to the invention.
Figure 5:
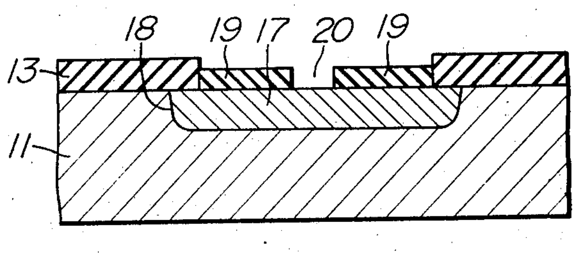

Further, a semiconductor device having the surface coating according to the invention may be made by providing a silicon nitride film 13 on the surface of a semiconductor substrate 11 in a manner to leave exposed at least a portion 16 of the semiconductor substrate surface as shown in FIG. 4, causing an impurity to diffuse through the exposed surface 16 by utilizing the silicon nitride film 13 as a mask, and simultaneously forming a thin silicon oxide film 19 on the exposed surface 16 as shown in FIG. 5. And further, as shown in FIG. 5, a hole 20 may be formed in the silicon oxide film 19 to diffuse another impurity into the substrate or deposit an electrode metal through the hole 20.

Figure 6:
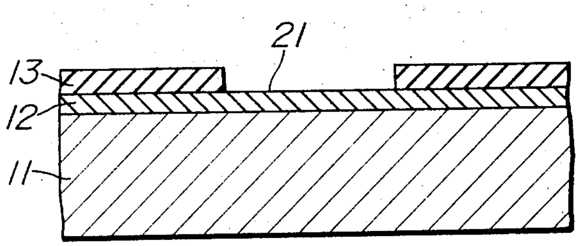
FIGS. 6 and 7 are vertical sectional views showing other forms of semiconductor elements having surface coatings according to the invention.

FIG. 6 is a vertical sectional view of another form of a semiconductor element having the surface coating according to the invention. Accoring to this embodiment, the surface coating of the invention comprises a silicon oxide film 12 provided on the surface of a semiconductor substrate 11 and a silicon nitride film 13 provided partly on the silicon oxide film 12.

Figure 7:
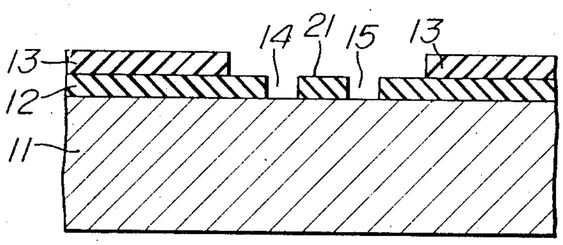

It is possible to obtain a desired semiconductor device from the semiconductor element having the surface coating as shown in FIG. 6 by forming holes 14 and 15 through that portion 21 of the silicon oxide film 12 which is not covered with the silicon nitride film 13 as shown in FIG. 7 and causing an impurity to selectively diffuse into the substrate or depositing an electrode metal through these holes.

Figure 8:
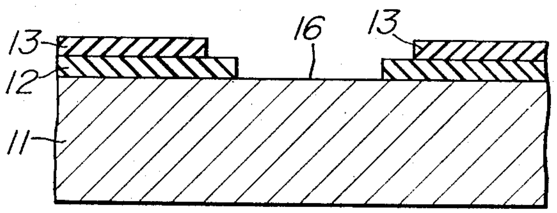
FIGS. 8 and 9 are vertical sectional views of semiconductor elements for illustrating steps for manufacturing them according to the invention.
Figure 9:
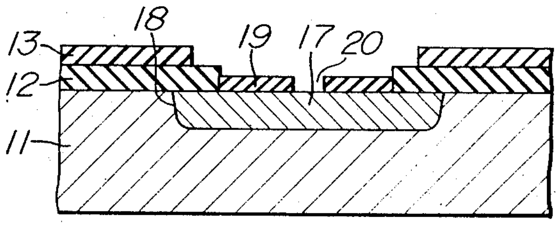

Further, as shown in FIG. 8 and FIG. 9, a semiconductor device having the surface coating according to the invention may be made by removing the greater portion of that part of the silicon oxide film 12 in the surface coating in FIG. 6 which is not covered with the silicon nitride film 13, causing an impurity to diffuse into the substrate 11, and simultaneously forming a thin silicon oxide film 19 on the exposed semiconductor surface 16. And further, a hole 20 may be formed in the silicon oxide film 19 to cause another impurity to diffuse or to deposit an electrode metal through that hole.

Some embodiments for causing selective diffusion of gallium into a semiconductor substrate by use of the surface coating according to the present invention will next be described.

Figure 10:
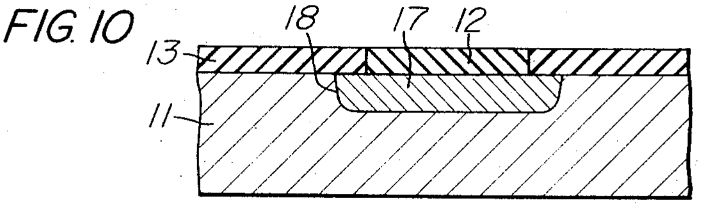
FIGS. 10 and 11 are vertical sectional views of the semiconductor elements shown in FIGS. 2 and 6 to which gallium is diffused, respectively.
Figure 11:
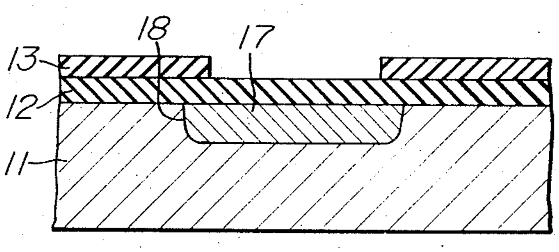

The present invention is based on the finding that a silicon nitride film has a masking action for gallium although a silicon oxide film exhibits no masking action for gallium. On the basis of the above finding, the semiconductor substrate having the surface coating of the invention as, for example, shown in FIG. 2 or 6 may be exposed to a gallium-rich atmosphere so that gallium can penetrate through the silicon oxide film 12 into the semiconductor substrate 11 to form a diffused layer 17 as shown in FIGS. 10 and 11, respectively. In case the semiconductor substrate 11 comprises an N-type semiconductor, a PN junction 18 is formed in the semiconductor substrate by this gallium diffusion treatment and the end edge of this PN junction 18 is covered with the silicon nitride film 13 as will be seen in both FIGS. 10 and 11.

Gallium and another impurity can be simultaneously diffused into the semiconductor substrate in case of a semiconductor element as, for example, shown in FIG. 3 or 7 in which holes are formed through the silicon oxide film on the semiconductor substrate surface. In this case, the latter impurity is selectively diffused through the openings 14 and 15, while gallium is simultaneously diffused into the substrate with the silicon nitride film 13 acting as a mask. Therefore, when the substrate 11 comprises an N-type semiconductor, for example, gallium and arsenic or gallium and antimony may be simultaneously diffused to obtain an NPN transistor by a single manufacturing step.

Manufacturing processes for the actual manufacture of semiconductor devices such as diodes or transistors according to the present invention will be described in detail.

EXAMPLE 1

Figure 12A:
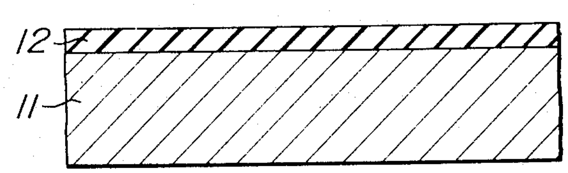
Figure 12B:
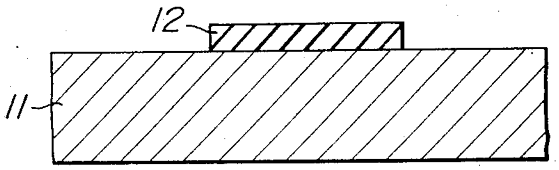
Figure 12C:
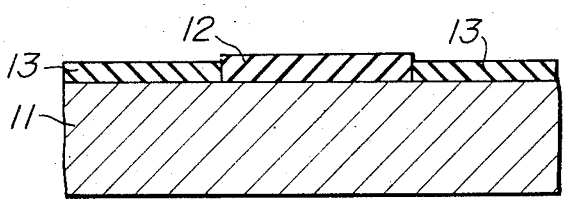

A single-crystalline substrate 11 of P-type silicon about 200 $\mu$ thick as shown in FIG. 12*a* is first prepared. After cleaning treatment on the surface of the substrate 11, a silicon oxide film 12 about 5,000 A to 10,000 A thick is formed on the substrate surface. The silicon oxide film 12 on the silicon substrate 11 may be formed by heating this substrate to a temperature above 1,000°C. in an oxidizing atmosphere for thereby causing thermal growth of the silicon oxide film 12 from the silicon substrate surface, or by causing thermal decomposition of organo-oxy-silane at a relatively low temperature of 700°C. to 800°C. for thereby causing deposition of the silicon oxide film 12 on the silicon substrate 11 from the vapor phase. In either case, the thickness of the silicon oxide film 12 can be suitably controlled by suitably controlling the duration of heat treatment. The conventional photo engraving technique is then applied for removing unnecessary portions of the silicon oxide film 12 by treating it with a liquid such, for example, as hydrofluoric acid to leave the silicon oxide film 12 on at least a portion of the surface of the silicon substrate 11 as shown in FIG. 12*b*. A silicon nitride film 13 about 200 A to 2,000 A thick is then formed on that part of the surface of the silicon substrate 11 which is not covered with the above silicon oxide film 12 as shown in FIG. 12*c*. The silicon nitride film 13 may, for example, be formed by exposing the silicon substrate shown in FIG. 12*b* to a nitrogen gas atmosphere and subjecting it to heat treatment at about 1,250°C. for about 30 minutes to 1 hour. Alternatively, the silicon nitride film 13 may be formed by employing hydrogen gas as a carrier gas, mixing a nitride such, for example, as ammonia ($NH_3$) or hydrazine ($N_2H_4$) with a silicon compound such, for example, as silane ($SiH_4$), entrained on the carrier gas, and causing reaction therebetween at a temperature of about 900°C. to 1,250°C. for thereby causing deposition of the silicon nitride film 13 on the silicon substrate 11 from the vapor phase.

Figure 12D:
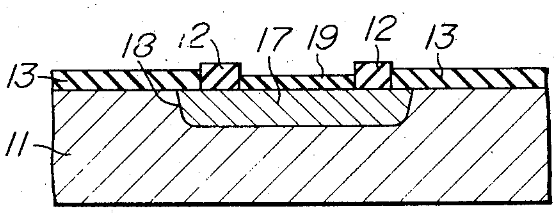
Figure 12E:
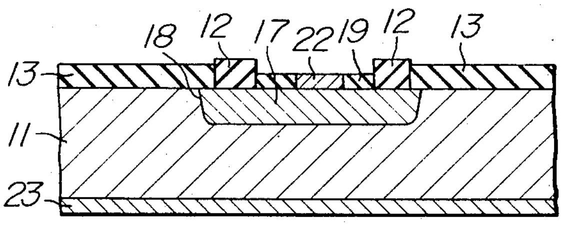

The conventional photo engraving technique is then applied again to remove a portion of the silicon oxide film 12 to thereby expose that portion of the silicon substrate 11 as shown in FIG. 12*d*. An impurity such, for example, as phosphorus, arsenic or antimony is caused to diffuse through this exposed surface into the substrate 11 to form an N-type diffused region 17 therein. During this diffusion treatment, a fresh silicon oxide film 19 about 1,000 A to 2,000 A thick is newly formed on the exposed silicon substrate surface. By the formation of this N-type diffused region 17, a PN junction 18 is formed between the N-type region 17 and the P-type substrate 11 and the end edge of this PN junction 18 is covered with the silicon nitride film 13. The conventional photo engraving technique is then again applied to this newly formed silicon oxide film 19 to form a small hole therethrough and an electrode metal, for example, aluminum is deposited through this hole to provide an aluminum electrode 22. An electrode metal 23 is also deposited on the bottom surface of the substrate 11 to complete a diode as shown in FIG. 12*e*. The electrode 22 may be formed by removing solely that portion of the silicon oxide film 19 convering the surface of the semiconductor diffused region on which the electrode is to be formed for thereby exposing that portion of the substrate, depositing a metal such as aluminum on the entire surface by the vacuum evaporation method, and then removing unnecessary aluminum by the conventional photo engraving technique.

Figure 12F:
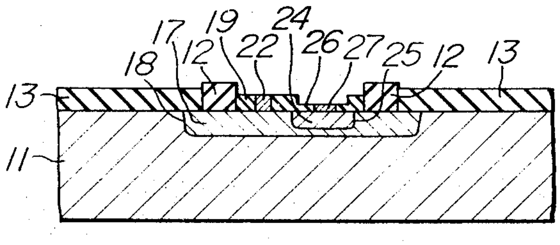

Further in FIG. 12*d*, a small hole may be formed through the newly formed silicon oxide film 19, and boron may be diffused through this hole into the substrate 11 to form a P-type diffused region 24 therein as shown in FIG. 12*f*. Then, holes extending to the P-type region 24 and the N-type region 17 may be formed through a thin silicon oxide film 26 formed during the above boron diffusing process and the silicon oxide film 19, respectively, and aluminum electrodes 27 and 22 may be deposited according to the conventional deposition method to obtain a PNP transistor.

EXAMPLE 2

The next description will be directed to a manufacturing process for the manufacture of semiconductor devices such as diodes or transistors by selectively diffusing gallium into a semiconductor substrate by use of the surface coating according to the present invention.

Figure 13A:
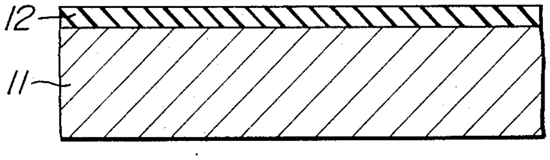
Figure 13B:
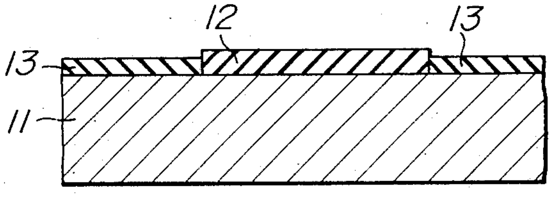
Figure 13C:
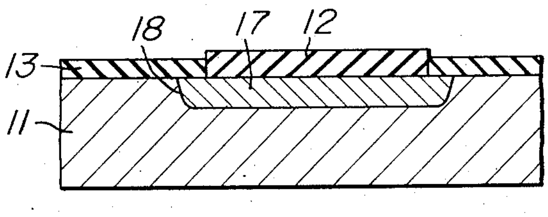
Figure 13D:
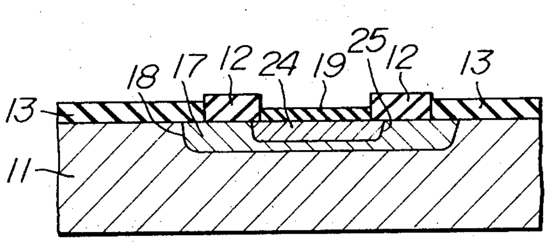
Figure 13E:
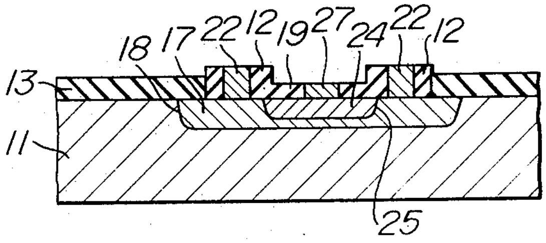

As shown in FIG. 13*a*, a silicon oxide film 12 about 5,000 A to 10,000 A thick is formed on the surface of a single-crystalline N-type silicon substrate 11 about 250 $\mu$ thick in the manner as described with reference to FIG. 12*a*. A portion of the silicon oxide film 12 is then removed in the manner as described with reference to FIG. 12*b* and a silicon nitride film 13 about 200 A to 2,000 A thick is formed on the exposed substrate surface as shown in FIG. 13*b*. This substrate 11 is then kept at a temperature of about 1,160°C. and a gallium gas at about 900°C. entrained on a carrier gas being hydrogen is made to flow over the surface of the substrate 11 to cause diffusion of gallium into the silicon substrate 11. Since the silicon nitride film 13 does not permit permeation therethrough of gallium, a P-type diffused region 17 is formed beneath the silicon oxide film 12 as shown in FIG. 13*c* and the end edge of a PN junction 18 between the P-type region 17 and the N-type substrate 11 is covered with the silicon nitride film 13. The conventional photo engraving technique is then applied to form a hole through a desired portion of the silicon oxide film 12 and phosphorus is diffused through that hole into the substrate 11 to form an N-type diffused region 24 therein as shown in FIG. 13*d*. A thin silicon oxide film 19 is newly formed as shown in FIG. 13*d* during the above phosphorus diffusion step. Holes extending to the N-type region 24 and the P-type region 17 thus formed in the semiconductor substrate 11 are formed through the respective silicon oxide films 19 and 12 and electrode metals 27 and 22 are deposited in these holes to obtain an NPN transistor as shown in FIG. 13*e*.

A diode having a region in which gallium is selectively diffused may be obtained by causing diffusion of gallium as shown in FIG. 13*c*, forming an electrode depositing hole through the silicon oxide film 12 and depositing an electrode metal in this hole.

EXAMPLE 3

Referring to FIGS. 14*a* to 14*d*, a further example of the present invention will be described.

Figure 14A:
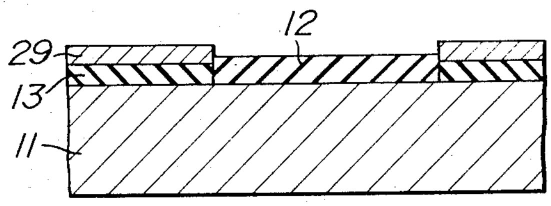
Figure 14B:
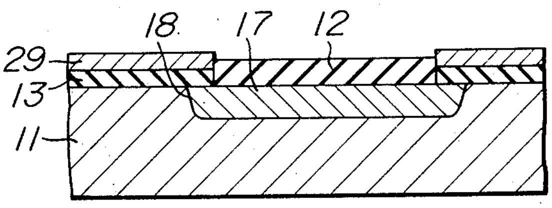

A silicon oxide film 12 is provided on at least a portion of the surface of a semiconductor substrate 11 of N-type silicon and then a silicon nitride film 13 is provided on the remaining substrate surface in the manner as described with reference to FIG. 12*b*. A silicon layer 29 is then deposited on a required portion of the substrate surface as shown in FIG. 14*a*. This silicon layer 29 may be formed on the substrate surface by the conventional vacuum evaporation method or by the vapor growth method utilizing the reduction of silicon tetrachloride ($SiCl_4$) by hydrogen and the conventional photo engraving technique is applied to remove an unnecessary portion of the silicon layer. Gallium is then diffused into the semiconductor substrate 11 with this silicon layer 29 left attached thereto so as to form a gallium diffusion layer 17 in the substrate 11 as shown in FIG. 14*b*.

Figure 14C:
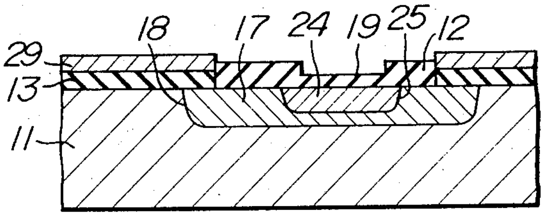

A hole is then formed through the central silicon oxide film 12 in the manner as described with reference to FIG. 13*d*, and an impurity such, for example, as phosphorus, arsenic or antimony is diffused through this hole to form an N-type diffused region 24 in the substrate 11 as shown in FIG. 14*c*. Holes are subsequently formed through desired portions of silicon oxide films 12 and 19, and electrode metals 22 and 27 are deposited in these holes to provide an NPN transistor.

Figure 14D:
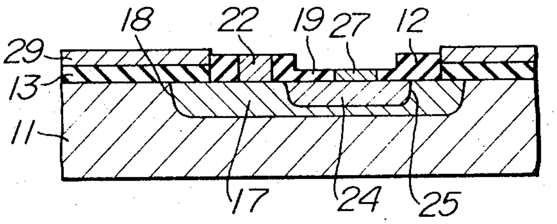

The silicon layer 29 employed in the present example may have its surface oxidized during the above diffusion treatment step, but this silicon layer 29 may be left in its existing state so that it may serve as a surface protective film for the semiconductor device in cooperation with the silicon oxide films 12, 19 and the silicon nitride film 13. If required, this silicon layer 29 may be removed after the electrode metal has been deposited as shown in FIG. 14*d*.

EXAMPLE 4

Figure 15A:
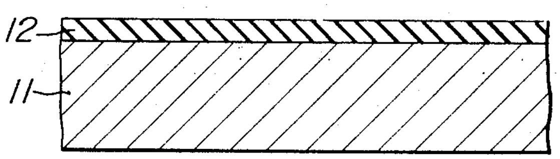
Figure 15B:
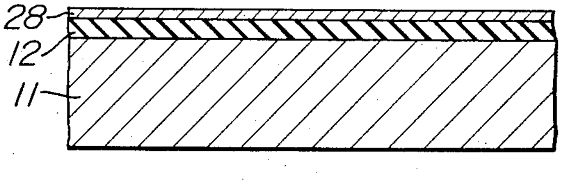

A further excellent embodiment of the present invention will next be described. As, for example, shown in FIG. 15*a*, a silicon oxide film 12 about 5,000 A to 10,000 A thick is formed on the surface of an N-type silicon substrate 11 about 250 $\mu$ thick. Then as shown in FIG. 15*b*, a silicon layer 28 about 100 A to 1,000 A thick is formed on the silicon oxide film 12. This silicon layer 28 may be formed by the conventional vacuum evaporation method or by the conventional vapor growth method utilizing the reduction of silicon tetrachloride ($SiCl_4$) by hydrogen.

Figure 15C:
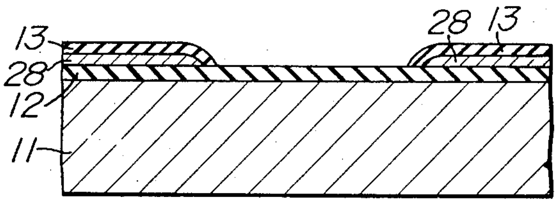
Figure 15D:
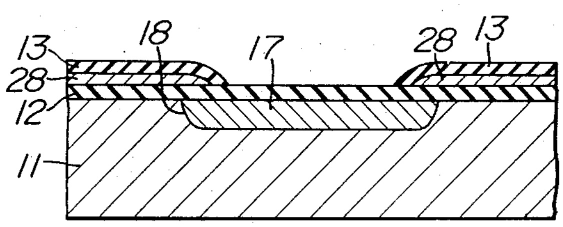

The conventional photo engraving technique is then applied to remove an unnecessary portion of the silicon layer 28. The silicon substrate 11 is subsequently subjected to heat treatment at about 1,250°C. for 30 minutes to 1 hour in a nitrogenous atmosphere to form a silicon nitride film 13 about 100 A to 500 A thick on the surface of the silicon layer 28 as shown in FIG. 15*c*. In lieu of heat treating the substrate in the nitrogenous atmosphere, the silicon nitride film 13 may be deposited on the silicon layer 28 by mixing silane ($SiH_4$) with ammonia ($NH_3$) to cause chemical reaction therebetween as described previously. In this case, the silicon layer 28 acts to give a strong bond between the silicon oxide film 12 and the silicon nitride film 13. Then when this silicon substrate 11 is kept at a temperature of about 1,160°C. and a gallium gas heated to 900°C. and entrained on a carrier gas being hydrogen gas is made to flow over the substrate surface, gallium diffuses through the silicon oxide film 12 into the substrate 11 to form a P-type diffused region 17 therein as shown in FIG. 15*d*. The end edge of a PN junction 18 formed between the P-type region 17 and the N-type substrate 11 is covered with the silicon nitride film 13 through the silicon oxide film 12.

Figure 15E:
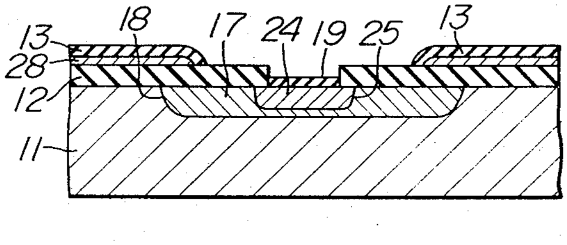
Figure 15F:
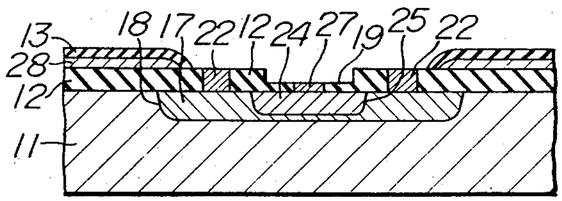

A hole is then formed through at least a portion of that part of the silicon oxide film 12 which is not covered with a silicon nitride film 13, and an N-type impurity such, for example, as phosphorus is diffused through this hole to form an N-type diffused region 24 as shown in FIG. 15*e*. During this diffusion step, a fresh thin silicon oxide film 19 is formed at the opening through which phosphorous is diffused. Finally, holes are formed through required portions of the silicon oxide films 12 and 19 as shown in FIG. 15*f* and electrode metals 22 and 27 are deposited therein to complete an NPN transistor.

From the foregoing description giving detailed explanation as to various embodiments of the present invention, it will be understood that at least a portion of the surface of a semiconductor substrate in the semiconductor device according to the invention is directly covered with a silicon nitride film or indirectly covered with such silicon nitride film through a silicon oxide film interposed therebetween and thus the surface state of the semiconductor substrate surface beneath this silicon nitride film is very stable. Such high stability is considered to be derivable from the fact that the silicon nitride film, unlike the silicon oxide film, is operative to prevent intrusion of metal ions into the film during the impurity diffusion step or the electrode metal deposition step or other treatment steps. Further, as will be apparent from FIGS. 12*e*, 12*f*, 13*e*, 14*d* and 15*f*, the end edge terminating at the substrate surface of the PN junction formed in the semiconductor substrate of the semiconductor device according to the invention is covered with the silicon nitride film and the outer peripheral portion of the semiconductor substrate surface is also covered with the silicon nitride film. By virtue of the above structure, there is utterly no fear that the electrical properties of the semiconductor device are affected by the external atmosphere even if the interface between the surface coating and the substrate surface might be exposed to the exterior.

According to the present invention, further, a semiconductor device can be very easily made as in the case of making conventional planar type transistors since operating regions of the semiconductor device can be easily formed by suitable working treatments on the silicon oxide film as described previously.

Although in the various embodiments of the invention described above, silicon has been solely referred to as a substrate material, it will be readily understood that germanium or other common semiconductor materials other than silicon may be equally effectively employed. Moreover although the embodiments of the present invention have solely referred to the manufacture of semiconductor devices in the form of diodes or transistors, it will be apparent that the present invention is also applicable to the manufacture of the so-called integrated circuits having such elements as resistors, capacitors, diodes or transistors formed integrally in semiconductor substrates.

Although the invention has been shown and described in terms of specific embodiments, it will be evident that changes and modifications are possible which do not in fact depart from the inventive concepts taught herein.

We claim:

1. A method of making a semiconductor device comprising the steps of forming a first surface coating consisting essentially of silicon oxide and a second surface coating including a silicon nitride film on different surface portions, respectively, of a semiconductor substrate, and forming at least one hole in said first surface coating.

2. A method of making a semiconductor device according to claim 1, further comprising the steps of forming a metal electrode on said semiconductor substrate surface through said hole in said first surface coating.

3. A method of making a semiconductor device according to claim 1, further comprising the step of causing an impurity to diffuse into said substrate through said hole in said first surface coating for thereby forming a diffused region beneath said first surface coating, forming a third surface coating extending from said first surface coating in a manner to cover the surface of said diffused region, said third surface coating consisting essentially of silicon oxide, removing a portion of said third surface coating for thereby forming in said third surface coating a second hole extending to said diffused region, and providing a metal electrode on said diffused region through said second hole.

4. A method of making a semiconductor device comprising the steps of selectively covering a surface of a semiconductor substrate with a surface coating including a silicon nitride film, and then diffusing gallium into said substrate.

5. A method of making a semiconductor device comprising the steps of forming a first surface coating consisting essentially of silicon oxide and a second surface coating including a silicon nitride film on different surface portions, respectively, of a semiconductor substrate, diffusing gallium into said semiconductor substrate for thereby forming a gallium diffusion layer in that portion of said substrate which lies beneath said first surface coating, and removing a portion of said first surface coating above said gallium diffusion layer for thereby forming in said first surface coating a hole extending to said gallium diffusion layer.

6. A method of making a semiconductor device according to claim 5, further comprising the steps of diffusing an impurity into the substrate through the hole in said first surface coating for thereby forming a second diffusion layer in said gallium diffusion layer, forming a third surface coating consisting essentially of silicon oxide extending from said first surface coating in a manner to cover said second diffusion layer, forming a second and a third holes in said first surface coating on said gallium diffusion layer and in said third surface coating on said second diffusion layer, respectively, and providing metal electrodes on said gallium diffusion layer and said second diffusion layer through said second and third holes, respectively.

7. A method for manufacturing a semiconductor device comprising the steps of forming a first silicon oxide layer on a surface portion of a semiconductor substrate, and forming a silicon nitride layer on a surface portion of the semiconductor substrate which is not covered with said silicon oxide layer.

8. A method according to claim 7, further comprising the step of forming in said silicon oxide layer a hole to expose a surface portion of the substrate.

9. A method for manufacturing a semiconductor device comprising the steps of forming a silicon oxide layer on a surface of a semiconductor substrate, depositing a silicon layer on said silicon oxide layer, and forming a silicon nitride layer on said silicon layer.

10. A method for manufacturing a semiconductor device comprising the steps of forming a silicon oxide layer on a surface portion of a semiconductor substrate, forming a silicon nitride layer on a surface portion of said semiconductor substrate to surround said silicon oxide layer, and forming a hole extending to the surface of said semiconductor substrate in said silicon oxide layer.

11. A method for manufacturing a semiconductor device, comprising the steps of forming on a semiconductor substrate a mask layer including a silicon layer, the silicon layer covering a selective portion of a major surface of the semiconductor substrate but being spaced from the major surface by means of an insulating film interposed therebetween, and diffusing a conductivity type determining impurity selectively into the semiconductor substrate which is not covered with the silicon layer.

12. The method according to claim 11, wherein the insulating film consists essentially of insulating material selected from the group consisting of silicon oxide and silicon nitride.

13. A method for manufacturing a semiconductor device comprising the steps of selectively covering a surface of a silicon substrate with a first insulating film consisting essentially of silicon nitride and then heating the combination in an oxidizing atmosphere so as to form a second insulating film consisting essentially of silicon oxide on the surface of the silicon substrate which is not covered with the first insulating film.

14. A method for manufacturing a semiconductor device comprising the steps of forming an insulating film consisting essentially of silicon nitride partially on a surface of a silicon body and then oxidizing the exposed body on which the insulating film is not formed.

15. A method of making a semiconductor device, comprising the steps of forming a first surface coating essentially consisting of one of the two materials consisting of silicon oxide and silicon nitride on at least a portion of a major surface of a substrate and forming a second surface coating including the other of said two materials on another portion of said major surface different from said one portion.

16. A method for manufacturing a semiconductor device according to claim 11, wherein said conductivity type impurity is of gallium.

17. A method for manufacturing a semiconductor device, comprising the steps of forming an insulating film on a semiconductor substrate, forming a silicon layer on said insulating film so as to cover a selective portion of a major surface of said substrate but to be spaced from said substrate, and then introducing a conductivity type determining impurity selectively into a portion of the substrate not covered with said silicon layer.

* * * * *